United States Patent
Yu et al.

(10) Patent No.: US 6,891,170 B1
(45) Date of Patent: May 10, 2005

(54) MODULAR MANIPULATION SYSTEM FOR MANIPULATING A SAMPLE UNDER STUDY WITH A MICROSCOPE

(75) Inventors: Min-Feng Yu, Dallas, TX (US); Mark J. Dyer, San Jose, CA (US); Ken Bray, Garland, TX (US)

(73) Assignee: Zyvex Corporation, Richardson, TX (US)

( * ) Notice: Subject to any disclaimer, the term of this patent is extended or adjusted under 35 U.S.C. 154(b) by 110 days.

(21) Appl. No.: 10/173,543

(22) Filed: Jun. 17, 2002

(51) Int. Cl.[7] .................................................. G21K 5/10
(52) U.S. Cl. ................................................ 250/442.11
(58) Field of Search ........................... 250/306, 442.11, 250/397, 311, 307, 310

(56) References Cited

U.S. PATENT DOCUMENTS

| | | | |
|---|---|---|---|
| 3,134,942 A | 5/1964 | Rhodes | |
| 3,535,515 A | 10/1970 | Jones et al. | |
| 3,714,423 A | 1/1973 | Lucas | |
| 4,463,257 A | 7/1984 | Simpkins et al. | |
| 4,587,431 A | 5/1986 | Uemura | |

(Continued)

FOREIGN PATENT DOCUMENTS

| | | | |
|---|---|---|---|
| JP | 2001198896 A | 7/2001 | |
| JP | 2002033366 A | 1/2002 | |
| WO | WO 96/13724 | 5/1996 | |
| WO | WO96/20495 A | 7/1996 | |
| WO | WO 00/10191 | 8/1999 | |
| WO | WO0010191 A | 2/2000 | |
| WO | WO/01/09965 | 2/2001 | |
| WO | WO/02/16089 | 2/2002 | |

OTHER PUBLICATIONS

S. Fatikow, et al., "A Flexible Microrobot–Based Microassembly Station", University of Kartsruhe, Institute for Process Control and Robotics, Kaiserstr. 12 (40.28), D–76128, Karlsruhe, Germany.

"Investment Approaches: Lux NanoSphere: Measurement", Nanotechnology, The Nanotech Report 2001, pp. 122–136.

Technical Data from Klocke Nanotechnik, Dr. Volker Klocke, Aachen, Germany, printed Nov. 2002, 85 pages.

Yu, Minfeng et al., "Three–dimensional manipulation of carbon nanotubes under a scanning electron microscope", 1999 IOP Publishing Ltd., pp. 244–252.

U.S. Appl. No. 10/173,542, filed Jun. 17, 2002, Dyer et al.

Fatikow, et al., "A Flexible Microrobot–Based Microassembly Station," Emerging Technologies and Factory Automation, 1999. Proceedings ETFA '99. 1999 7th IEEE International Conference, Barcelona, Spain Oct. 18–21, 1999, Piscataway, NJ USA, pp. 397–406.

*Primary Examiner*—John R. Lee
*Assistant Examiner*—Johnnie L Smith, II
(74) *Attorney, Agent, or Firm*—Haynes and Boone, LLP

(57) ABSTRACT

A modular manipulation system and method for using such modular manipulation system for manipulating a sample under study with a microscope are provided. According to at least one embodiment, a platform is provided that comprises an interface to a microscope, a sample stage, and a plurality of interfaces for receiving manipulator modules for manipulating a sample arranged on the sample stage. Preferably, the plurality of interfaces for receiving manipulator modules are each capable of detachably coupling a manipulator module to the platform. Thus, in a preferred embodiment, a user may selectively couple one or more desired manipulator modules to the platform to enable a desired type of manipulation to be performed on a sample under study. Accordingly, a preferred embodiment enables great flexibility in configuring a manipulation system in a desired manner.

59 Claims, 6 Drawing Sheets

U.S. PATENT DOCUMENTS

| | | |
|---|---|---|
| 4,601,551 A | 7/1986 | Pettingell et al. |
| 4,729,646 A | 3/1988 | Clark et al. |
| 4,798,989 A | 1/1989 | Miyazaki et al. |
| 4,919,001 A | 4/1990 | Ogiwara et al. |
| 5,036,205 A | 7/1991 | Clement et al. |
| 5,055,680 A | 10/1991 | Kesmodel et al. |
| 5,124,645 A | 6/1992 | Rhoden et al. |
| 5,225,683 A | 7/1993 | Suzuki et al. |
| 5,237,238 A | 8/1993 | Berghaus et al. |
| 5,412,503 A | 5/1995 | Nederlof |
| 5,455,420 A | 10/1995 | Ho et al. |
| 5,510,615 A | 4/1996 | Ho et al. |
| 5,568,004 A | 10/1996 | Kleindiek |
| 5,635,836 A | 6/1997 | Kirtley et al. |
| 5,756,997 A | 5/1998 | Kley |
| 5,922,179 A | 7/1999 | Mitro et al. |
| 5,939,816 A | 8/1999 | Culp |
| 6,000,280 A | 12/1999 | Miller et al. |
| 6,002,136 A | 12/1999 | Naeem |
| 6,127,681 A * | 10/2000 | Sato et al. .................. 250/306 |
| 6,127,682 A | 10/2000 | Nakamoto |
| 6,198,299 B1 | 3/2001 | Hollman |
| 6,279,389 B1 | 8/2001 | Adderton et al. |
| 6,346,710 B1 | 2/2002 | Ue |
| 6,403,968 B1 * | 6/2002 | Hazaki et al. ......... 250/442.11 |
| 6,452,307 B1 | 9/2002 | Olin et al. |
| 6,501,289 B1 | 12/2002 | Takekoshi |
| 6,538,254 B1 * | 3/2003 | Tomimatsu et al. .... 250/442.11 |
| 6,583,413 B1 * | 6/2003 | Shinada et al. ............. 250/310 |
| 2001/0044156 A1 | 11/2001 | Kelly et al. |
| 2002/0064341 A1 | 5/2002 | Fauver et al. |

* cited by examiner

MODULAR MANIPULATION SYSTEM FOR MANIPULATING A SAMPLE UNDER STUDY WITH A MICROSCOPE

CROSS-REFERENCE TO RELATED APPLICATIONS

This application is related to concurrently filed and commonly assigned U.S. patent application Ser. No. 10/173,542 entitled "MANIPULATION SYSTEM FOR MANIPULATING A SAMPLE UNDER STUDY WITH A MICROSCOPE", the disclosure of which is hereby incorporated herein by reference.

TECHNICAL FIELD

The present invention relates in general to a manipulation system for manipulating a sample under study with a microscope, and more particularly to a modular manipulation system that preferably comprises a platform capable of receiving a plurality of manipulation modules for manipulating a sample.

BACKGROUND OF THE INVENTION

Much development is being achieved on the micrometer ($\mu$m) and nanometer (nm) size scales. For example, much work is being performed at these small size scales in such scientific fields as biology, medicine, physics, chemistry, electronics, engineering, and nanotechnology to, for example, study objects (e.g., materials, organisms, viruses, bacteria, etc.), create new objects, and/or assemble objects together with great precision.

To perform manipulation of objects on such a small size scale, it is often necessary to use microscope equipment to aid in observing the objects. For instance, the smallest object that human beings can see with the unaided eye is about 0.1 millimeter (mm). With a good light microscope (also referred to as an "optical microscope"), an image may be magnified up to about 1500 times. However, magnification achievable with light microscopes is limited by the physics of light (i.e., the wavelength of light) upon which the operation of such microscopes is based. For example, light microscopes have relatively limited resolving power (ability to distinguish clearly between two points very close together). The resolving power, a, is measured by the angular separation of two point sources that are just detectably separated by the instrument. The smaller this angle, the greater the resolving power. Thus, in general $\alpha = 1.22 \lambda / D$, where $\lambda$ is the wavelength of the light used and D is the diameter of the objective lens in meters (m). The best resolving power that can be achieved with a light microscope is around 0.2 $\mu$m. Points closer together than this cannot be distinguished clearly as separate points using a light microscope.

Of course, by reducing the wavelength of the radiation used in a microscope to view an object, the resolution obtainable can be improved. Thus, electron microscopes have been developed that use a beam of electrons, rather than light, to study objects too small for conventional light microscopes. Max Knoll and Ernst Ruska constructed the first electron microscope around 1930. In general, electron microscopes use a beam of electrons to irradiate a sample under study, wherein the wavelength of such electron beam (generally resulting from magnetic forces acting on the beam) is much smaller than the wavelength of light used in light microscopes. Accordingly, the amount of magnification (and the resolving power) achievable with an electron microscope is much improved over that of light microscopes.

Modern electron microscopes typically comprise: (1) an electron gun to produce a beam of accelerated electrons; (2) an image producing system that includes electrostatic lenses (e.g., generally formed by electromagnetic or permanent magnets) and metal apertures to confine and focus the electron beam, pass it through, or over, the surface of the specimen and create a magnified image; (3) an image viewing and recording system, which typically includes photographic plates or a fluorescent screen; and (4) a vacuum pump to keep the microscope under high vacuum, as air molecules may deflect electrons from their paths. The development of the electron microscope has had a massive impact on knowledge and understanding in many fields of science. Modern electron microscopes can view detail at the atomic level with sub-nanometer resolution (e.g., 0.1 nm resolution, which is 1000 times better than conventional light microscopes) at up to a million times magnification.

Various different types of electron microscopes have been developed. Such electron microscopes generally work on the above-described principles of using a directed beam of electrons, as opposed to light, for studying samples. One type of electron microscope is the transmission electron microscope (TEM). In a TEM, electrons are transmitted through a thinly sliced specimen and typically form an image on a fluorescent screen or photographic plate. Those areas of the sample that are more dense transmit fewer electrons (i.e., will scatter more electrons) and therefore appear darker in the resulting image. TEMs can magnify up to one million times and are used extensively, particularly in such scientific fields as biology and medicine to study the structure of viruses and the cells of animals and plants, as examples.

Another type of electron microscope is the scanning electron microscope (SEM). In an SEM, the beam of electrons is focussed to a point and scanned over the surface of the specimen. Detectors collect the backscattered and secondary electrons coming from the surface and convert them into a signal that in turn is used to produce a realistic, three-dimensional image of the specimen. During the scanning process, the detector receives back fewer electrons from depressions in the surface, and therefore lower areas of the surface appear darker in the resulting image. SEMs generally require the specimen to be electrically conducting. Thus, specimens that are not conducting are typically coated (e.g., using a sputter coater) with a thin layer of metal (often gold) prior to scanning. SEMs can magnify up to around one hundred thousand times or more and are used extensively, particularly in such scientific areas as biology, medicine, physics, chemistry, and engineering to, for example, study the three-dimensional ("3-D") structure of surfaces from metals and ceramics to blood cells and insect bodies.

In addition to the above-described light and electron microscopes, various other types of microscopes have also been developed to aid in the study of micro- and/or nano-scale objects, including without limitation scanning probe microscopes (SPMs). Various types of SPMs have been developed, such as atomic force microscopes (AFMs), scanning tunnelling microscope (STM), and near field optical scanning microscope (NOSM), as examples. Microscopes have traditionally been used for imaging (e.g., viewing specimens). However, to provide greater utility, a recent trend has been to include a manipulator mechanism that may be used in conjunction with the microscope for manipulating a specimen being imaged by the microscope. For example, manipulator mechanisms, such as probes, have been developed to be integrated within an SEM for manipulating a sample being imaged by the SEM. For instance, LEO ELECTRON MICROSCOPY LTD. has proposed certain manipulating mechanisms for use with an SEM. Further, manipulator mechanisms, such as probes, have been developed to be integrated within a TEM for manipulating a sample being imaged by the TEM. For instance, NANO-FACTORY INSTRUMENTS has proposed certain in situ probes for TEMs.

BRIEF SUMMARY OF THE INVENTION

As described above, manipulating mechanisms (e.g., probes) have been developed for use with microscopes, such as SEMs and TEMs, in order to allow manipulation of a sample being imaged by such microscopes. However, manipulating mechanisms of the existing art comprise relatively inflexible configurations. For example, such manipulating mechanisms generally do enable a user flexibility in configuring a plurality of desired manipulator mechanisms within a system for manipulating a sample under study with a microscope. Further, many such manipulating systems are fixedly integrated with a microscope. Also, such manipulation systems often require modifications to a microscope with which they are coupled that interfere with the traditional functionality of such microscope. Further still, most manipulation systems of the prior art comprise relatively few (e.g., one) manipulating mechanism (e.g., probe) that is operable for manipulating a sample.

The present invention is directed to a modular manipulation system and method for using such modular manipulation system for manipulating a sample under study with a microscope. According to at least one embodiment of the present invention, a platform is provided that comprises an interface to a microscope, a sample stage, and a plurality of interfaces for receiving manipulator modules for manipulating a sample arranged on the sample stage. In certain embodiments, the platform's interface to a microscope enables the platform to be detachably coupled to such microscope. For instance, the platform is, in certain implementations, suitable for being inserted into a sample chamber of the microscope. Further, the plurality of interfaces for receiving manipulator modules are each preferably capable of detachably coupling a manipulator module to the platform. Thus, in a preferred embodiment, a user may selectively couple one or more desired manipulator modules to the platform to enable a desired type of manipulation to be performed on a sample under study. Accordingly, a preferred embodiment enables great flexibility in configuring a manipulation system in a desired manner.

According to at least one embodiment of the present invention, a system is provided that comprises a platform having a sample stage and an interface for coupling to a microscope such that a sample arranged on the sample stage can be imaged by the microscope. The system further comprises a plurality of manipulator modules detachably coupled to the platform for manipulating a sample arranged on the sample stage. Preferably, the platform is suitable for coupling at least to a scanning electron microscope (SEM), but may be suitable for coupling to another type of microscope in certain implementations. Preferably, the manipulator modules each comprise an end-effector and a drive mechanism for driving movement of its respective end-effector.

According to at least one embodiment of the present invention, a portable sample holder is provided for holding a sample for presentation to a microscope. The portable sample holder comprises a stage for receiving a sample. The portable sample holder further comprises a plurality of interface sites, each of such plurality of interface sites for receiving a manipulator module, wherein the manipulator module comprises an end-effector and a drive mechanism for driving movement of the end-effector for manipulating a received sample. The portable sample holder further comprises an interface for coupling with a microscope.

According to at least one embodiment of the present invention, a method of manipulating a sample under study with a microscope is provided. The method comprises selecting at least one manipulator module to use in manipulating a sample. The method further comprises coupling each of the selected manipulator module(s) to one of a plurality of interface sites on a manipulator platform. The method further comprises arranging a sample on the manipulator platform, and interfacing the manipulator platform with a microscope such that the sample arranged thereon can be imaged by the microscope. The method further comprises using the manipulator module(s) coupled to the manipulator platform to manipulate the sample.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
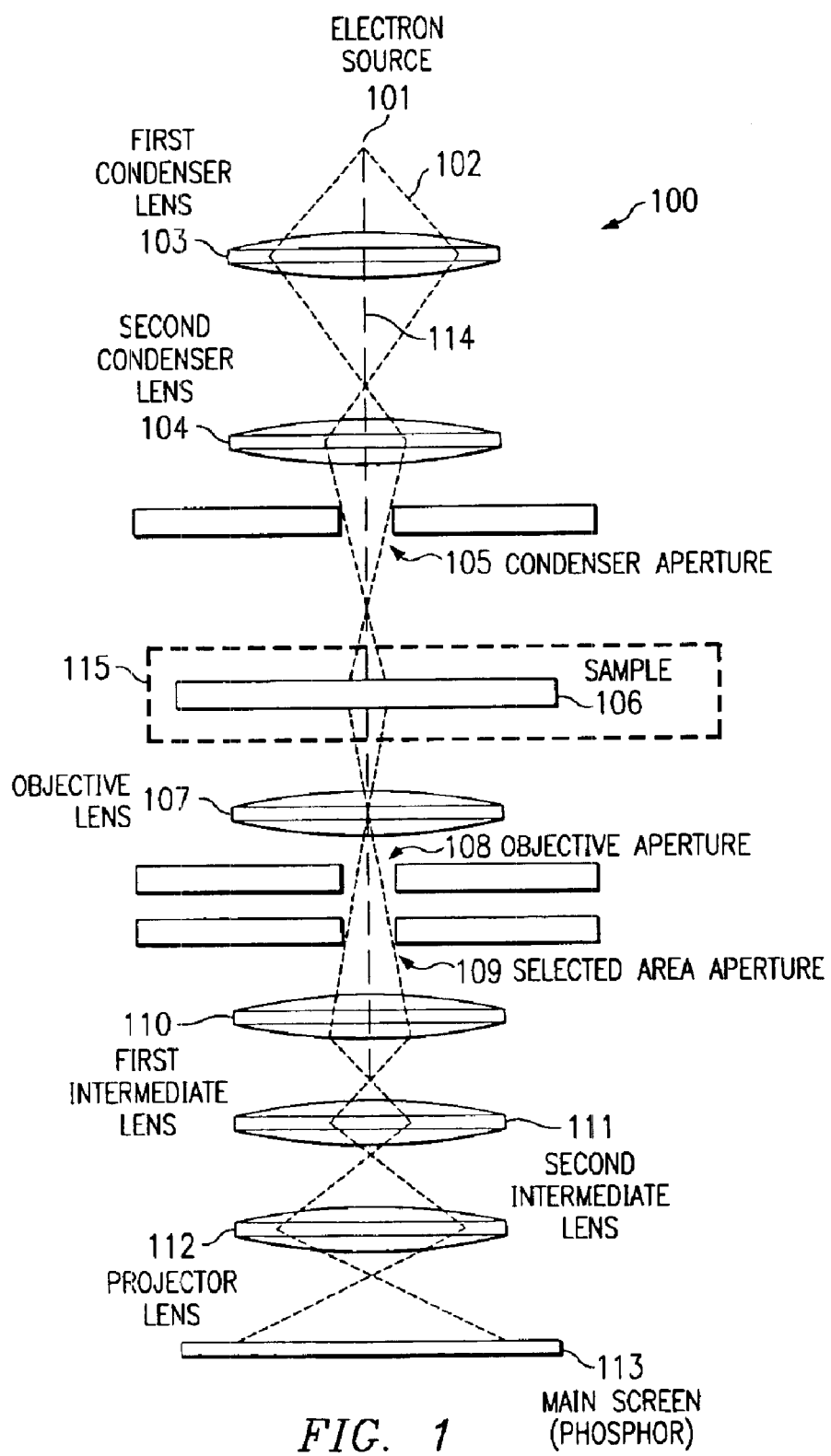
FIG. 1 shows a typical configuration of a TEM.

Various embodiments of the present invention are now described with reference to the above figures, wherein like reference numerals represent like parts throughout the several views. According to embodiments of the present invention, a manipulation system is provided for use in manipulating a sample that is under study with a microscope. Preferably, the manipulation system is modular in that various different types of manipulator modules may be selectively coupled with a platform to enable the platform to be configured for performing a desired type of manipulation.

"Manipulation" is used herein in its broadest sense, and is not intended to be limited solely to actions that result in a change in the sample under study. Rather, certain types of manipulation may not alter the sample at all, but may instead aid in observing the sample (e.g., measuring certain characteristics of the sample). For example, Webster defines "manipulate" as "to treat or operate with the hands or by mechanical means especially in a skillful manner". MERRIAM-WEBSTER'S COLLEGIATE DICTIONARY, Deluxe Edition, 1998 (ISBN 0-87779-714-5). As used herein, the term "manipulate" (as well as variances thereof, such as "manipulation", etc.) is intended to encompass Webster's definition in that it includes "treating" or "operating" on a sample, which does not necessarily result in a modification to the sample (but may instead simply aid in observing a characteristic thereof). However, as described further below, the types of manipulation are not intended to be limited to being performed by "mechanical means", but are also intended to encompass various other types of manipulating means, such as electrical means, etc.

In certain embodiments of the present invention, a manipulation system comprises a platform having a sample stage and an interface for coupling to a microscope such that a sample arranged on the sample stage can be imaged by the microscope. The manipulation system may further comprise a plurality of manipulator modules detachably coupled to the platform for manipulating a sample arranged on the sample stage. Most preferably, the platform is capable of coupling at least with an SEM. The manipulator modules may each comprise an end-effector, such as a probe, gripper, etc., and a drive mechanism for driving movement of the end-effector. Preferably, each manipulator module is independently operable to drive the operation of its respective end-effector. For instance, a platform may be configured with a plurality of manipulator modules coupled thereto, wherein each manipulator module is independently operable to impart translational movement to its respective end-effector in at least three dimensions.

In certain embodiments, the manipulation system comprises a manipulation platform (which may be referred to as a "sample holder") that is portable. Preferably, such manipulation platform is capable of being coupled to a microscope in order to add desired sample manipulation capability to the microscope without requiring modification of the microscope itself. That is, preferably the manipulation platform is implemented such that it can be coupled to a microscope to enable not only imaging of a sample with the microscope, but also manipulation of such sample using the manipulation platform, and the manipulation capability is preferably added to a microscope without requiring modification of the microscope. Rather, according to certain embodiments, a manipulation platform (or "sample holder") that comprises manipulation modules coupled thereto may be detachably coupled to a microscope in a manner that does not require modification of the microscope itself. For example, microscopes such as TEMs and SEMs typically comprise a sample chamber for receiving a sample holder, and certain embodiments of the present invention provide a sample holder (or "manipulation platform") that is suitable for interfacing with such a sample chamber comprises a stage for receiving a sample to be imaged by a microscope and further comprises one or more manipulator modules for manipulating the sample. Therefore, in certain embodiments, in situ manipulation is provided by the sample holder (or "manipulation platform"), which can be readily dislodged from a microscope (e.g., from the microscope's sample chamber) without introducing any interference for other microscope users desiring to operate the microscope in standard way, thus allowing such users access to the full functionality provided by the microscope instrument itself.

For instance, in certain embodiments, a portable sample holder for holding a sample for presentation to a microscope comprises a stage for receiving a sample. The sample holder further comprises a plurality of interface sites, each of which are for receiving a manipulator module. As mentioned above, a manipulator module may comprise an end-effector and a drive mechanism for driving movement of the end-effector for manipulating a sample received on the sample stage. Thus, a manipulator module that is controllably operable for manipulating a sample may be selectively coupled to each of the plurality of interface sites to configure the portable sample holder for a desired type of sample manipulation.

The portable sample holder further comprises an interface for coupling with a microscope. Thus, the sample holder may be used to present a sample to a microscope for imaging, and the sample holder may comprise manipulator module(s) selectively coupled therewith for manipulating such sample. Preferably, the sample holder (or "manipulation platform") of embodiments of the present invention is capable of interfacing with a microscope in a manner that does not otherwise interfere with the normal operation (e.g., imaging functionality) of such microscope. Thus, the manipulation system may preferably be interfaced to a microscope, such as an SEM, to provide the ability to manipulate a sample under study, but does not interfere with a user desiring to utilize the standard functionality (e.g., imaging functionality) of the microscope. For instance, a user may either remove the manipulation platform from a microscope and replace it with a traditional sample holder for such microscope to enable traditional operation of the microscope, or the user may simply not use the manipulator modules of the manipulation platform but instead use only the traditional functionality of the microscope itself (e.g., imaging functionality).

As described above, microscopes play a vital role in analyzing and otherwise working with samples at a micrometer and/or nanometer scale. Various different types of microscopes, including without limitation light microscopes, electron microscopes (e.g., TEMs, SEMs, etc.), and SPMs have been developed for studying samples at such small size scales. While alternative embodiments of the present invention may be applied to any one or more types of microscopes now known or later developed, a preferred embodiment is applicable to electron microscopes. As described further below, a most preferred embodiment is applicable at least to SEMs. Accordingly, to better understand some of the advantages offered by certain embodiments of the present invention, examples of electron microscopes available in the existing art are described in greater detail hereafter in conjunction with FIGS. 1–2. More particularly, a typical configuration of a TEM is described with FIG. 1, and a typical configuration of an SEM is described with FIG. 2. Thereafter, example implementations of embodiments of the present invention are described in conjunction with FIGS. 3–5, and an example implementation of a preferred embodiment implemented with an SEM is described in conjunction with FIG. 6. Thereafter, an example of how embodiments of the present invention may be used to perform manipulation of a sample under study with a microscope is described in conjunction with the operational flow diagram of FIG. 7.

While typical configurations of a TEM and SEM are described below in conjunction with FIGS. 1–2, it should be understood that embodiments of the present invention are not limited to the example configurations described. Rather, certain embodiments of the present invention may be utilized with any other configuration of TEMs and SEMs now known or later developed. Additionally, while a preferred embodiment provides a manipulation system that is capable of being utilized at least with an SEM, other embodiments of the present invention may be configured such that they may be utilized with one or more other types of microscopes now known or later developed (including without limitation light microscopes, SPMs and/or other types of electron microscopes, such as TEMs) in addition to or instead of SEMs.

As described briefly above, electron microscopes are scientific instruments that use a beam of highly energetic electrons to examine specimens on a very fine scale. This examination can yield a great deal of information, including the following: (1) Topography: the surface features of a specimen or "how it looks", its texture; direct relation between these features and materials properties (hardness, reflectivity, etc.); (2) Morphology: the shape and size of the particles making up the specimen; direct relation between these structures and materials properties (ductility, strength, reactivity, etc.); (3) Composition: the elements and compounds that the specimen is composed of and the relative amounts of them; direct relationship between composition materials properties (melting point, reactivity, hardness, etc.); and (4) Crystallographic Information: how the atoms are arranged in the specimen; direct relation between these arrangements and materials properties (conductivity, electrical properties, strength, etc.).

Electron microscopes were developed due to the limitations of light microscopes, which are limited by the physics of light (i.e., the wavelength of light) to 500× or 1000× magnification and a resolution of approximately 0.2 $\mu$m. In the early 1930's this theoretical limit had been reached with light microscopes, and there was a scientific desire to see the fine details of the interior structures of organic cells (nucleus, mitochondria, etc.). This required 10,000× plus magnification, which was not possible to achieve using light microscopes. To overcome the limitations of light wavelengths utilized in light microscopes, electron microscopes were developed that utilize a beam of electrons to irradiate the specimen.

In general, electron microscopes function much like light microscopes, except they use a focused beam of electrons instead of light to "image" the specimen and gain information as to its structure and composition. The operation of electron microscopes generally involves the following: (1) a stream of electrons is formed (e.g., by an electron source) and accelerated toward the specimen using a positive electrical potential; (2) this stream is confined and focused using metal apertures and magnetic lenses into a thin, focused, monochromatic beam; (3) this beam is focused onto the sample using electrostatic lenses (generally magnetic lenses); and (4) interactions occur inside the irradiated sample, affecting the electron beam.

Turning first to FIG. 1, a schematic of an example configuration of a TEM 100 is shown. The TEM was the first type of electron microscope to be developed, and is patterned on the Light Transmission Microscope, except that a focused beam of electrons is used instead of light to "see through" the specimen. A TEM works much like a slide projector. A slide projector shines a beam of light through (transmits) the slide, as the light passes through the slide it is affected by the structures and objects on the slide. These effects result in only certain parts of the light beam being transmitted through certain parts of the slide. This transmitted beam is then projected onto the viewing screen, forming an enlarged image of the slide. TEMs generally work much the same way, except that they shine a beam of electrons (rather than light) through the specimen (as with the slide in a slide projector system). Whatever part is transmitted is typically projected onto a phosphor screen for the user to see. A more technical explanation of a typical TEM is described further below in conjunction with FIG. 1.

As shown in the example configuration of FIG. 1, TEM 100 comprises an electron source 101, which may comprise an electron gun, for producing a stream of monochromatic electrons 102. The stream 102 is focused to a small, thin, coherent beam by the use of condenser lenses 103 and 104. The first condenser lens (103), which is usually controlled by the "spot size knob" (not shown) of the TEM, largely determines the "spot size" (i.e., the general size range of the final spot that strikes the sample). The second lens (104), which is usually controlled by the "intensity or brightness knob" (not shown) of the TEM, actually changes the size of the spot on the sample (e.g., changing it from a wide dispersed spot to a pinpoint beam). The beam 102 is restricted by the condenser aperture 105 (usually user selectable), knocking out high angle electrons (e.g., those far from the optic axis 114). The beam 102 strikes the sample (or "specimen") 106 and parts of it are transmitted. This transmitted portion of beam 102 is focused by the objective lens 107 into an image.

Optional objective and selected area metal apertures (labeled 108 and 109, respectively) may be included to restrict the beam. The objective aperture 108 may enhance contrast by blocking out high-angle diffracted electrons, and the selected area aperture 109 may enable the user to examine the periodic diffraction of electrons by ordered arrangements of atoms in the sample 106. The image is passed down the column through the intermediate and projector lenses 110, 111, and 112, being enlarged along the way. The image strikes the phosphor image screen 113 and light is generated, allowing the user to see the image. Typically, the darker areas of the image represent those areas of the sample 106 through which fewer electrons were transmitted (i.e., areas of the sample 106 that are thicker or denser), and the lighter areas of the image represent those areas of the sample 106 through which more electrons were transmitted (i.e., areas of the sample 106 that are thinner or less dense).

As further shown in the schematic of FIG. 1, a TEM typically comprises a sample chamber 115 into which a sample 106 is placed for imaging. For instance, a sample holder that is removable from chamber 115 may comprise a stage on which sample 106 may be placed. Thus, sample 106 may be placed on the stage of a sample holder, and the sample holder may then be inserted into sample chamber 115. Sample chamber 115 comprises a defined interface for receiving such a sample holder. For example, TEM sample chambers typically comprise an interface to accept a standard sample holder of approximately 3 mm in thickness, approximately 9 mm in width and approximately 9 centimeters (cm) in length for loading a thin sample generally having approximately 3 mm in diameter.

Figure 2:
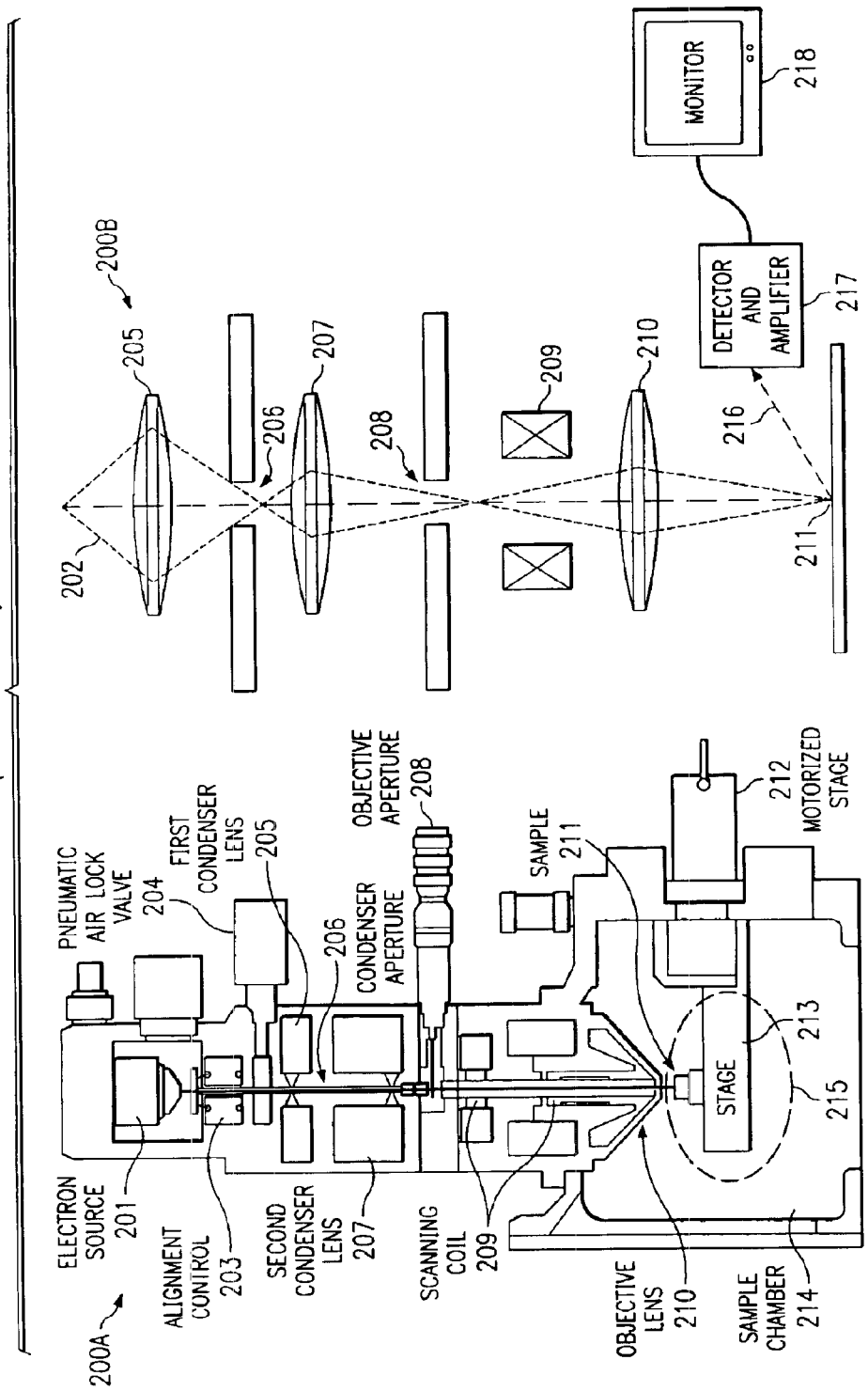
FIG. 2 shows a typical configuration of an SEM.

Turning to FIG. 2, an example configuration of an SEM is shown. FIG. 2 shows a high-level block diagram 200A and a schematic representation 200B of a typical configuration of an SEM. As shown, an SEM comprises an electron source 201, which may comprise an electron gun, for producing a stream of monochromatic electrons 202. Alignment control 203 is utilized to align the direction of the generated stream 202 with the below-described components of the SEM.

The stream 202 is condensed by the first condenser lens 205, which is usually controlled by the "coarse probe current knob" (not shown) of the SEM. This lens 205 is used to both form the beam and limit the amount of current in the beam. It works in conjunction with the condenser aperture 206 to eliminate the high-angle electrons from the beam. The beam is constricted by the condenser aperture 206 (usually not user selectable), eliminating some high-angle electrons. The second condenser lens 207 forms the electrons 202 into a thin, tight, coherent beam and is usually controlled by the "fine probe current knob" (not shown) of the SEM.

A user-selectable objective aperture 208 further eliminates high-angle electrons from the beam. A set of coils 209 then "scan" or "sweep" the beam in a grid fashion, dwelling on points for a period of time determined by the scan speed (usually in the microsecond range). The final lens, the objective lens 210, focuses the scanning beam onto the part of the sample (or specimen) 211, as desired. When the beam strikes the sample 211 (and dwells for a few microseconds) interactions occur inside the sample and are detected with various instruments. For instance, secondary and/or backscattered electrons 216 are detected and amplified by detector and amplifier 217. Before the beam moves to its next dwell point, these instruments (e.g., detector and amplifier 217) essentially count the number of interactions and display a pixel on a display 218 (e.g., cathode ray tube (CRT)) whose intensity is determined by the counted number of interactions (e.g., the more reactions the brighter the pixel). This process is repeated until the grid scan is finished and may then be repeated. The entire pattern may be scanned 30 times per second, for example. Thus, the resulting image on display 218 may comprise thousands of spots (or pixels) of varying intensity that correspond to the topography of the sample 211.

As further shown in the block diagram 200A, an SEM typically comprises a sample chamber 214 into which a sample 211 is placed for imaging. For instance, a sample holder that is removable from chamber 214 may comprise stage 213 on which sample 211 may be placed. Thus, sample 211 may be placed on stage 213 of a sample holder, and the sample holder may then be inserted into sample chamber 214. Sample chamber 214 comprises a defined interface 215 for receiving such a sample holder. The defined interface 215 for an SEM is generally different than the defined interface of the sample chamber of commercially available TEMs, such as the interface described above with FIG. 1 for sample chamber 115 of TEM 100. For example, SEM sample chambers typically comprise an interface to accept relatively large samples, if needed, in the space allowed inside the chamber, such as approximately 15 cm by 15 cm by 6 cm. Usually, motorized stage 212 is included in the SEM to enable movement of stage 213 within sample chamber 214. Also, pneumatic air lock valve 204 is typically utilized to create a vacuum within the SEM once a sample 211 has been inserted into sample chamber 214, as air molecules may deflect electrons of the generated beam from their intended paths.

Figure 3:
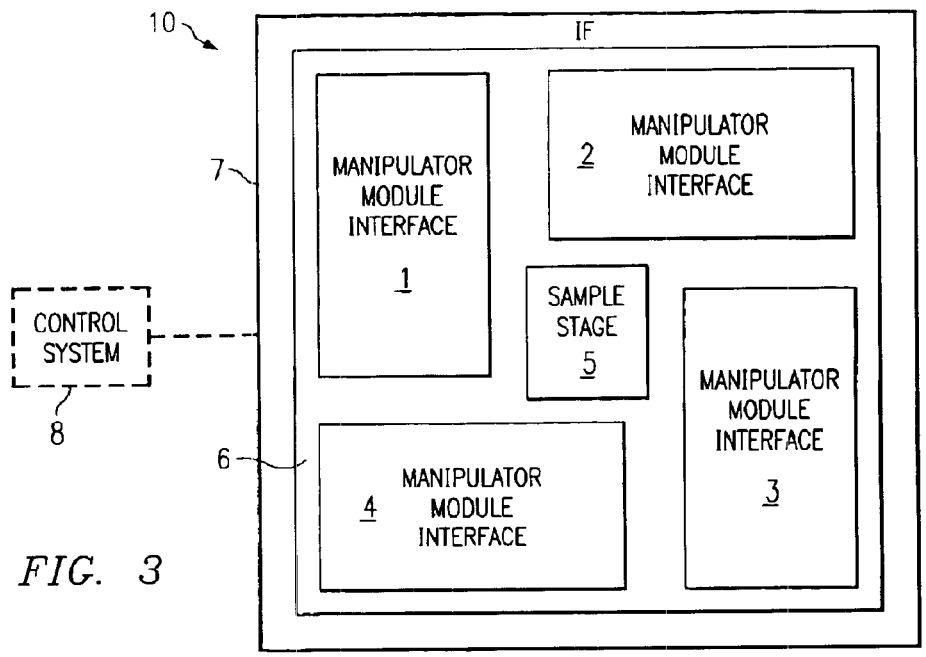
FIG. 3 shows an example configuration of a preferred embodiment of the present invention in block diagram form.

Turning now to FIG. 3, an example configuration of a preferred embodiment of the present invention is shown as a block diagram. In this example configuration, the manipulation system comprises a manipulation platform 10 that includes a base 6 on which a plurality of manipulator module interface sites are arranged, such as sites 1, 2, 3, and 4. Each of the manipulator module interface sites 1–4 are capable of receiving a manipulator module, as described more fully below. While four such interface sites are shown in the example configuration of FIG. 3, it should be understood that in alternative configurations a different number of such interface sites (either fewer than or greater than 4) may be implemented. However, as described in greater detail below, it is most preferable for platform 10 to include at least four manipulator module interface sites (such as sites 1–4 shown in the example of FIG. 3), as having at least four manipulator modules coupled to such platform may allow for particular types of manipulations (e.g., measurements, characterizations, etc.) on a sample to be achieved that are not readily achievable with less than four manipulator modules.

Platform 10 preferably comprises a sample stage 5 for receiving a sample to be studied using a microscope. Thus, manipulator modules may be coupled to one or more of manipulator module interface sites 1–4, as described more fully below, to perform manipulation of a sample arranged on sample stage 5. Platform 10 further comprises an interface 7 that enables base 6 to be coupled to a microscope such that a sample arranged on sample stage 5 can be imaged by such microscope. Thus, for example, once platform 10 is coupled to a microscope, a sample arranged on sample stage 5 may be imaged as manipulator module(s) arranged at one or more of interface sites 14 are utilized to manipulate the sample.

As further shown in FIG. 3, a control system 8 may be coupled to platform 10 to enable a user to control the operation of manipulator module(s) coupled to interface sites 14 in order to manipulate a sample in the manner desired. Control system 8 may comprise any suitable processor-based system, such as a personal computer (PC), that is capable of controlling the operation of manipulator module(s) coupled to interface sites 14. For example, a user may input commands (e.g., via a keyboard, pointer device, joystick, etc.) to control system 8, and in response to such input commands, control system 8 may communicate command signals (e.g., electrical signals) to the appropriate manipulator modules coupled to platform 10 in order to control the operation of such manipulator modules. For instance, communication paths (not shown in FIG. 3), such as conductive (e.g., metal) traces, may be provided on platform 10 to each of manipulator module interfaces 1–4, and control system 8 may interface with platform 10 in a manner that enables command signals to be communicated from such control system 8 to one or more of such manipulator module interfaces via the communication paths.

Of course, suitable software may be executing on control system 8 to control the manipulator modules coupled to platform 10. For example, software may be executing on control system 8 to generate the appropriate command signals to be communicated to one or more of manipulator module interface sites 1–4 responsive to user input to control system 8 and/or responsive to feedback received from one or more manipulator modules by such control system 8. Further, software may be executing on control system 8 to output (e.g., via a display, printer, audio speakers, and/or other output device included in control system 8) information to a user. For instance, information about the positioning of the manipulator modules coupled to platform 10 may be provided to a user via control system 8. Additionally or alternatively, information about measurements acquired by the manipulator modules in manipulating a sample may be output by control system 8. That is, in performing manipulation operations on a sample, the manipulator modules may output information to control system 8, and such control system 8 may output to a user the received information and/or further information derived by such control system 8 from the information received by the manipulator modules.

Additionally or alternatively, manipulator modules may, in certain implementations, comprise logic for communicating to control system 8 their individual operative capabilities. For instance, a manipulator module may comprise logic for communicating to control system 8 information about its movement capabilities (e.g., whether it can generate translational movement in one or more of three orthogonal dimensions X, Y, and Z and/or whether it can generate rotational movement). Further, the manipulator module may, in certain implementations, comprise logic for communicating to control system 8 information about its end-effector (e.g., the type of end-effector included in the manipulator module). In certain embodiments, control system 8 may output this information about the operative capabilities of each manipulator module on platform 10 to a user. Further, in certain embodiments, control system 8 may include software that is operable to determine from the operative capabilities of the manipulator module(s) coupled to platform 10 various different types of manipulation operations that are available to a user, given the manipulator module(s) of platform 10. Thus, for instance, control system 8 may analyze the operative capabilities of the manipulator modules coupled to platform 10 and output the types of manipulation operations that a user may perform with such manipulator modules. In this manner, control system 8 may aid a user in recognizing the types of manipulations (e.g., the types of measurements that may be acquired for a sample and/or the types of assembly operations) that may be performed using the manipulator modules coupled to platform 10. As described further below, in certain embodiments the manipulator modules are detachably coupled to platform 10 such that a user may selectively configure platform 10 having the manipulator modules desired, and therefore control system 8 may, in certain embodiments, aid a user in recognizing the operative capabilities of any given configuration of platform 10.

Figure 4A:
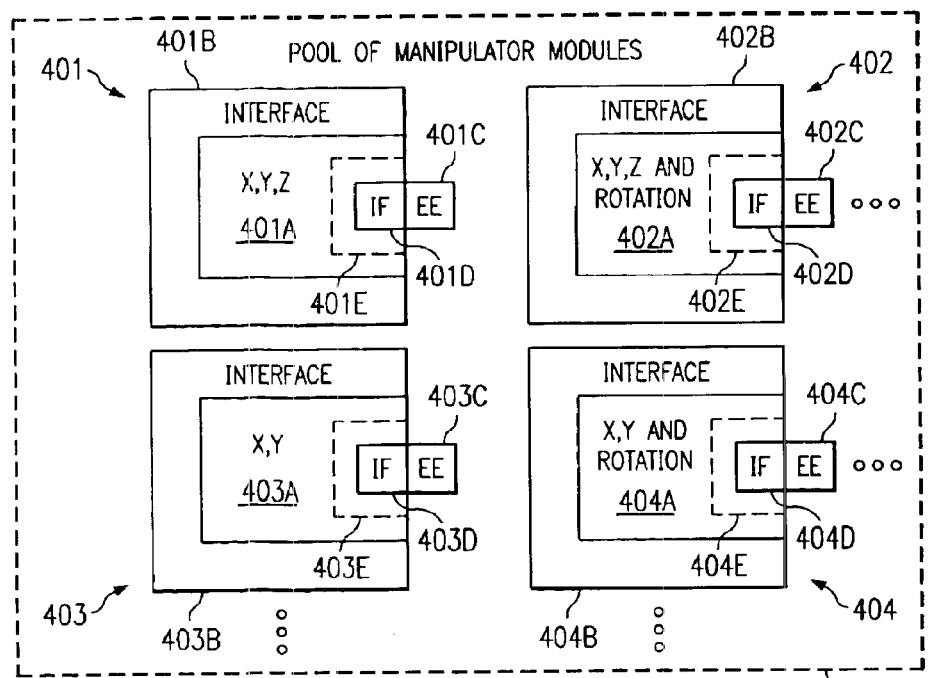
FIG. 4A shows an example pool of various manipulator modules that may be selectively coupled to a manipulation platform.

In certain embodiments, a manipulator module, such as those described further hereafter in conjunction with FIG. 4A, may be coupled to an interface site, such as site 1 on platform 10, in a manner that enables the command signals received at such interface site from control system 8 to be used in controlling the operation of such manipulator module. For instance, a manipulator module may interface with a given site 1–4 on platform 10 such that its communication interface (e.g., electrical input and/or output interface) couples with the site's communication path. For example, a manipulator module may comprise conductive traces for receiving input signals for controlling its operation, and when the manipulator module is coupled to an interface site of platform 10 (e.g., one of sites 14), its conductive traces couple with the appropriate conductive traces that communicatively couple such interface site to control system 8 to enable control system 8 to be used for controlling the operation of the coupled manipulator module. As mentioned above, in certain embodiments, conductive traces of a manipulator module for outputting signals (e.g., measurements, etc.) may be communicatively coupled to the appropriate conductive traces of platform 10 that communicatively couple the manipulator module's interface site to control system 8, such that control system 8 can receive signals from such manipulator module. With appropriate addition of motion and displacement sensors for each manipulator module, signals from such sensors can also be routed into control system 8. Control system 8 may be implemented with proper control software and hardware set up to then monitor the positioning of a manipulator module in real time, and if necessary, calibrate or correct the positioning. In certain implementations, control system 8 may also be coupled with the imaging system provided by the microscope to perform real-time object recognition and positioning identification for controlling positioning of the manipulator module(s) end-effector(s).

Thus, in operation, a user may arrange a sample on sample stage 5 (or on one of the manipulator modules) of platform 10. The user may further selectively couple desired manipulator modules to one or more of the interface sites 14 of platform 10. Platform 10 may then be coupled to a microscope in a manner that enables the sample on stage 5 (or, in certain implementations, on one of the manipulator modules coupled to platform 10) to be imaged, and the user may utilize control system 8 to controllably manipulate the sample with the selected manipulator module(s) coupled to platform 10.

Preferably, interface 7 enables platform 10 to be detachably coupled to at least one type of microscope for imaging a sample on sample stage 5. Most preferably, interface 7 enables platform 10 to be detachably coupled at least to SEMs, such as is described more fully hereafter in conjunction with the example of FIG. 6. Although, in alternative embodiments, interface 7 may enable platform 10 be coupled to one or more other types of microscopes in addition to or instead of SEMs. Further, interface 7 may, in certain embodiments, be adjustable to enable platform 10 to be detachably coupled to any of a plurality of different types of microscopes. For example, an adjustable interface such as is described in concurrently filed and commonly assigned U.S. patent application Ser. No. 10/173,542 titled "MANIPULATION SYSTEM FOR MANIPULATING A SAMPLE UNDER STUDY WITH A MICROSCOPE", the disclosure of which has been incorporated herein by reference, may be implemented for platform 10 to enable such platform to adapt to comply with any of a plurality of different microscope interfaces.

In view of the above, a preferred embodiment provides a platform 10 that comprises a sample stage 5 and a plurality of interface sites 1–4 to enable a selected manipulator module to be coupled thereto. Preferably, such interface sites enable a manipulator module to be detachably coupled thereto such that a user can selectively implement the desired manipulator module(s) on platform 10 for performing a desired type of manipulation on a sample. That is, a user can selectively reconfigure the platform 10 by interchanging various different manipulator modules on the interface sites 1–4.

Turning to FIG. 4A, an example pool 400 of various manipulator modules are shown, which may be selectively coupled to platform 10 (of FIG. 3) in order to configure platform 10 for performing a desired type of manipulation of a sample. In the example pool 400 of FIG. 4A, block diagrams of manipulator modules 401, 402, 403, and 404 are included. Of course, any number of manipulator modules may be included in pool 400 and be available for selection by a user in configuring platform 10 as desired.

Preferably, each manipulator module comprises an interface for detachably coupling with an interface site (e.g., one of sites 1–4) of platform 10. For example, manipulator modules 401–404 comprise interfaces 401B, 402B, 403B, and 404B, respectively. Such interfaces 401B, 402B, 403B, and 404B preferably comply with the interface sites 1–4 of platform 10 to enable any of manipulator modules 401–404 to be coupled to any of interface sites 1–4. The interface of a manipulator module (e.g., interface 401B of manipulator module 401) serves for mechanically fixing and electrically connecting the manipulator module to platform 10 via one of interface sites 1–4, so as the keep the integrity of each manipulator module. Interface sites 1–4 are so designed on platform 10 to fit the dimension requirement of the microscope(s) with which platform 10 is intended to be used, and each interface site 14 preferably includes mechanical and electrical connectors for operatively coupling a manipulator module to platform 10.

In one example implementation, approximately 10 electrical traces are available in each of interface sites 104, and when mechanically coupled therewith, a manipulator module may form an electrical connection with one or more of such electrical traces to communicatively couple with control system 8. For instance, certain manipulator modules may couple with a first number (e.g., 5) of the available electrical traces of an interface site to enable communication of control signals from control system 8 to such manipulator modules and/or output information from such manipulator modules to control system 8, and certain other manipulator modules may couple with a different number (e.g., 10) of the available electrical traces to enable an increased (or decreased) amount of control signals and/or output information to be communicated between control system 8 and the manipulator modules. For instance, certain manipulator modules may couple with a first number (e.g., 5) of the available electrical traces of an interface site to enable communication of control signals from control system 8 to such manipulator modules and/or output information from such manipulator modules to control system 8, and certain other manipulator modules may couple with a different number (e.g., 10) of the available electrical traces to enable an increased (or decreased) amount of control signals and/or output information to be communicated between control system 8 and the manipulator modules.

In a preferred embodiment, such as that described in conjunction with FIG. 5 below, each of interface sites 14 of platform 10 are approximately 15 mm by 15 mm in size (thus enabling a platform 10 that is suitable for interfacing with the sample chamber of an SEM). Of course, in alternative embodiments interface sites 14 may each have sizes other than 15 mm by 15 mm to enable platform 10 to be of appropriate size for interfacing with a desired microscope. For instance, a platform 10 that is configured to interface with a TEM's sample chamber, for example, may comprise interface sites that are smaller than 15 mm by 15 mm for receiving a manipulator module.

Each manipulator module of pool 400 preferably comprises an end-effector for manipulating a sample. For example, manipulator modules 401–404 comprise end-effectors (EE) 401C, 402C, 403C, and 404C, respectively. Such end-effectors may be utilized to engage and/or otherwise manipulate a sample arranged on sample stage 5 of platform 10. Examples of end-effectors that may be utilized are described further hereafter in conjunction with FIG. 4B. In certain implementations, the manipulator modules may comprise an interface for receiving any of a plurality of different types of end-effectors. For example, manipulator modules 401–404 comprise end-effector interfaces 401D, 402D, 403D, and 404D, respectively. Thus, in certain implementations, a manipulator module may have an interface (such as interfaces 401D, 402D, 403D, and 404D) that enables a user to detachably couple any of a plurality of different types of end-effectors to such manipulator module, such that a user may selectively configure the manipulator module to include a desired type of end-effector.

Further, each manipulator module preferably comprises a drive mechanism for controllably imparting movement to the manipulator module's end-effector. For example, an actuation mechanism for imparting translational movement and/or rotational movement to an end-effector may be included within a manipulator module. For example, manipulator modules 401–404 comprise drive mechanisms 401A, 402A, 403A, and 404A, respectively. More specifically, in the example of FIG. 4A, manipulator module 401 comprises a drive mechanism 401A that is operable to provide three degrees of translational movement (along three orthogonal axes X, Y, and Z) of end-effector 401C. Manipulator module 402 comprises a drive mechanism 402A that is operable to provide three degrees of translational movement (along three orthogonal axes X, Y, and Z), as well as rotational movement of end-effector 402C. Manipulator module 403 comprises a drive mechanism 403A that is operable to provide two degrees of translational movement (along two orthogonal axes X and Y) of end-effector 403C. Manipulator module 404 comprises a drive mechanism 404A that is operable to provide two degrees of translational movement (along two orthogonal axes X and Y), as well as rotational movement of end-effector 404C.

In certain embodiments, a manipulator module may comprise a first drive mechanism that enables relatively large, coarse movement of an end-effector, and the manipulator module may further comprise a second drive mechanism that enables relatively fine, precise movement of an end-effector. Accordingly, the first drive mechanism may be used to perform relatively coarse adjustment of the positioning of the manipulation module's end-effector relative to a sample on sample stage 5, and the second drive mechanism may be used for performing more fine/precise positioning of such end-effector. For instance, drive mechanism 401A of manipulator module 401 may comprise a first drive mechanism that provides relatively large, coarse X, Y, and Z movement of end-effector 401C, and drive mechanism 401A may further comprise a second drive mechanism 401E (shown in dashed line in FIG. 4A as being optional) that provides relatively fine, precise movement of end-effector 401C. Such second drive mechanism 401E may provide translational movement of end-effector 401C in one or more dimensions (e.g., X, Y, and/or Z movement) and/or rotational movement of end-effector 401C. Similar to manipulator module 401, manipulator modules 402–404 may each comprise a first drive mechanism for providing relatively large, coarse movement of their respective end-effectors, and a second drive mechanism 402E, 403E, and 404E, respectively, for providing relatively fine, precise movement of their respective end-effectors.

Thus, in a preferred embodiment, a manipulator module's drive mechanism may comprise a first drive mechanism that provides a relatively large range of movement for the module's end-effector (but may have less precision than the second drive mechanism) and a second drive mechanism that provides a relatively fine range of movement with great precision. For example, in one implementation of a preferred embodiment, a microactuator that provides a relatively large travel distance is implemented. For instance, a linear stepper microactuator may be implemented to provide such a large travel range for a manipulator module's end-effector. Linear stepper microactuators are well-known in the art, and therefore are not described in greater detail herein. In alternative implementations, any of various other suitable microactuators now known or later developed may be implemented within a manipulator module to provide a relatively large travel range for the module's end-effector, including without limitation a stick-slick piezoelectric actuator, an ultrasonic piezoelectric actuator, or an inchworm piezoelectric actuator, all of which are well-known in the art.

In one implementation of a preferred embodiment, a linear stepper microactuator is implemented in the first drive mechanism of a manipulator module and provides a translation range of several millimeters to the module's end-effector with a step resolution of approximately 30 nanometers. Thus, such a first drive mechanism may be utilized to move the module's end-effector in one or more dimensions (e.g., in the example of module 401, it provides such movement in three dimensions X, Y, and Z). More specifically, the first drive mechanism may comprise a plurality of such linear stepper microactuators to enable independent (or decoupled) movement of the manipulator module's end-effector in a plurality of dimensions. For instance, a first linear stepper microactuator may be implemented to impart movement to the end-effector in one dimension (e.g., along an X axis); a second linear stepper microactuator may be implemented to impart movement to the end-effector in an orthogonal dimension (e.g., along a Y axis); and a third linear stepper microactuator may be implemented to impart movement to the end-effector in a third orthogonal dimension (e.g., along a Z axis). The precision of positioning the end-effector using such linear stepper microactuators is generally limited by the resolution of the microactuator's step (i.e., the distance of each step). In the example implementation described above, the step resolution of the linear stepper microactuators used is approximately 30 nanometers, and therefore such microactuators of a manipulator module's first drive mechanism may be used to position the module's end-effector to within approximately 30 nanometers of a desired position.

Further, in a preferred embodiment, a manipulator module's drive mechanism may comprise a second drive mechanism that provides a relatively fine range of movement with great precision. For example, in one implementation of a preferred embodiment, a microactuator that provides very precise movement is implemented. For instance, a piezo tube may be implemented to provide such precise movement of a manipulator module's end-effector. For instance, a quadruple electroded piezoelectric tube may be implemented to provide such precise movement of a manipulator module's end-effector in free space in the range of a few microns with sub-nanometer resolution. Such quadruple electroded piezoelectric tubes are well-known in the art, and therefore are not described in greater detail herein. Alternatively, such well-known actuators as a piezostack, a piezo bimorph, or a simple piezo plate, as examples, may be used if such fine translation of the module's end-effector is needed in only one dimension.

In one implementation of a preferred embodiment, a quadruple electroded piezoelectric tube is implemented in the second drive mechanism of a manipulator module and provides a translation range of several micrometers to the module's end-effector with resolution of approximately 1 nanometer (or less). Thus, such a second drive mechanism may be utilized to move the module's end-effector in one or more dimensions (e.g., it may provide such movement in three dimensions X, Y, and Z) a relative small distance (e.g., up to several micrometers) with great precision (e.g., approximately 1 nanometer precision). Accordingly, such second drive mechanism of a manipulator module may be utilized to perform very precise positioning of the module's end-effector in order to perform desired manipulation of a sample.

In certain embodiments, a manipulator module may comprise only a single drive mechanism, such as a drive mechanism that enables relatively fine, precise movement of an end-effector (e.g., drive mechanism 401E, 402E, 403E, and 404E). For instance, such a single drive mechanism for a manipulator module may comprise a quadruple electroded piezoelectric tube that provides a translation range of several micrometers to the module's end-effector with resolution of approximately 1 nanometer (or less). Having a single drive mechanism may be beneficial in certain embodiments in that it may enable the modular manipulation system to be configured for use with a microscope that has a relatively limited sample chamber, such as the sample chamber of commercially available TEMs. For instance, as is described in concurrently filed and commonly assigned U.S. Patent Application Ser. No. 10/173,542 titled "MANIPULATION SYSTEM FOR MANIPULATING A SAMPLE UNDER STUDY WITH A MICROSCOPE", the disclosure of which has been incorporated herein by reference, by including only a high-precision actuator for each manipulator mechanism within the manipulation system (or "sample holder"), such manipulation system may be capable of having a plurality of manipulator mechanisms arranged therein and still be of suitable size for interfacing with a relatively limited sample chamber, such as the sample chamber of commercially available TEMs. As further described in "MANIPULATION SYSTEM FOR MANIPULATING A SAMPLE UNDER STUDY WITH A MICROSCOPE", a coarse adjustment mechanism that is independent from the manipulation system (or "sample holder") may be utilized in certain implementations to engage the manipulator mechanisms coupled to platform 10 and provide relatively long-range, coarse movement to their end-effectors in order to initially position such end-effectors, and thereafter, the internal actuator associated with each manipulator mechanism may be used to perform high-precision movement thereof (e.g., for manipulating a sample under study).

Figure 4B:
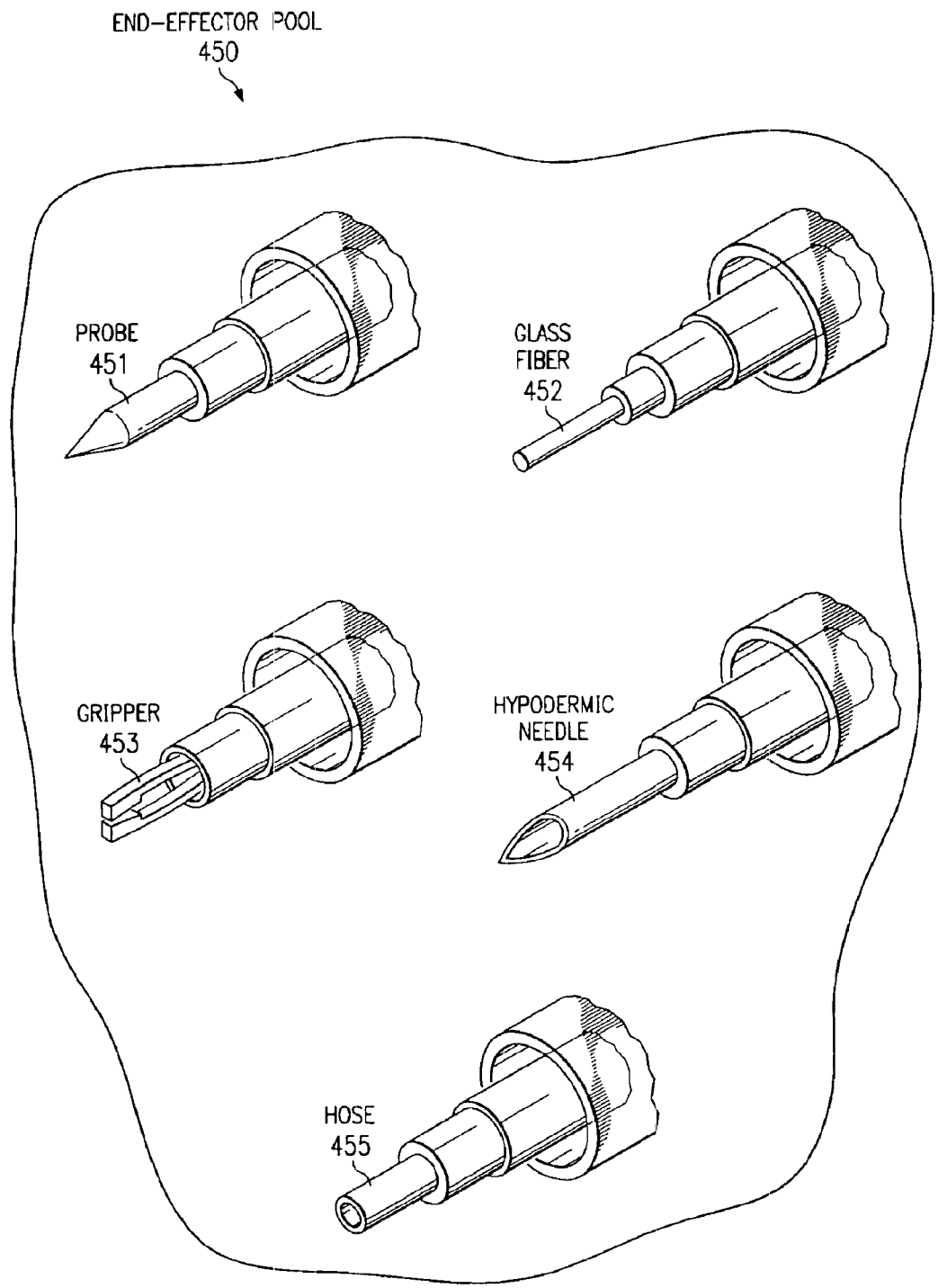
FIG. 4B shows an example pool of various end-effectors that may be selectively coupled to a manipulator module.

Turning now to FIG. 4B, examples of end-effectors that may be implemented on a manipulator module are shown. More specifically, an example pool 450 of various end-effectors are shown. In certain embodiments, such end-effectors may be selectively coupled to any of a plurality of different manipulator modules (such as the manipulator modules of pool 400 in FIG. 4A) in order to configure a manipulator module as desired for performing manipulation of a sample. In the example pool 450 of FIG. 4B, example end-effectors 451, 452, 453, 454, and 455 are included. Of course, any number of end-effectors may be included in pool 450 and be available for selection by a user in configuring a manipulator module as desired. In this example, end-effector 451 comprises a probe, end-effector 452 comprises a glass fiber, end-effector 453 comprises a gripper, end-effector 454 comprises a hypodermic needle, and end-effector 455 comprises a hose. Such end-effectors 451–455 may be utilized to engage and/or otherwise manipulate a sample arranged on sample stage 5 of platform 10. Various other types of end-effectors now known or later developed may be included in pool 450 in addition to or instead of the example end-effectors shown in FIG. 4B.

In certain implementations, a manipulator module may comprise an interface for receiving any of the various different end-effectors of pool 450. For example, manipulator modules 401–404 of FIG. 4A comprise end-effector interfaces 401D, 402D, 403D, and 404D, respectively. Thus, in certain implementations, a manipulator module may have an interface (such as interfaces 401D, 402D, 403D, and 404D) that enables a user to detachably couple any of the end-effectors of pool 450 to such manipulator, such that a user may selectively configure the manipulator module to include a desired type of end-effector.

Figure 5:
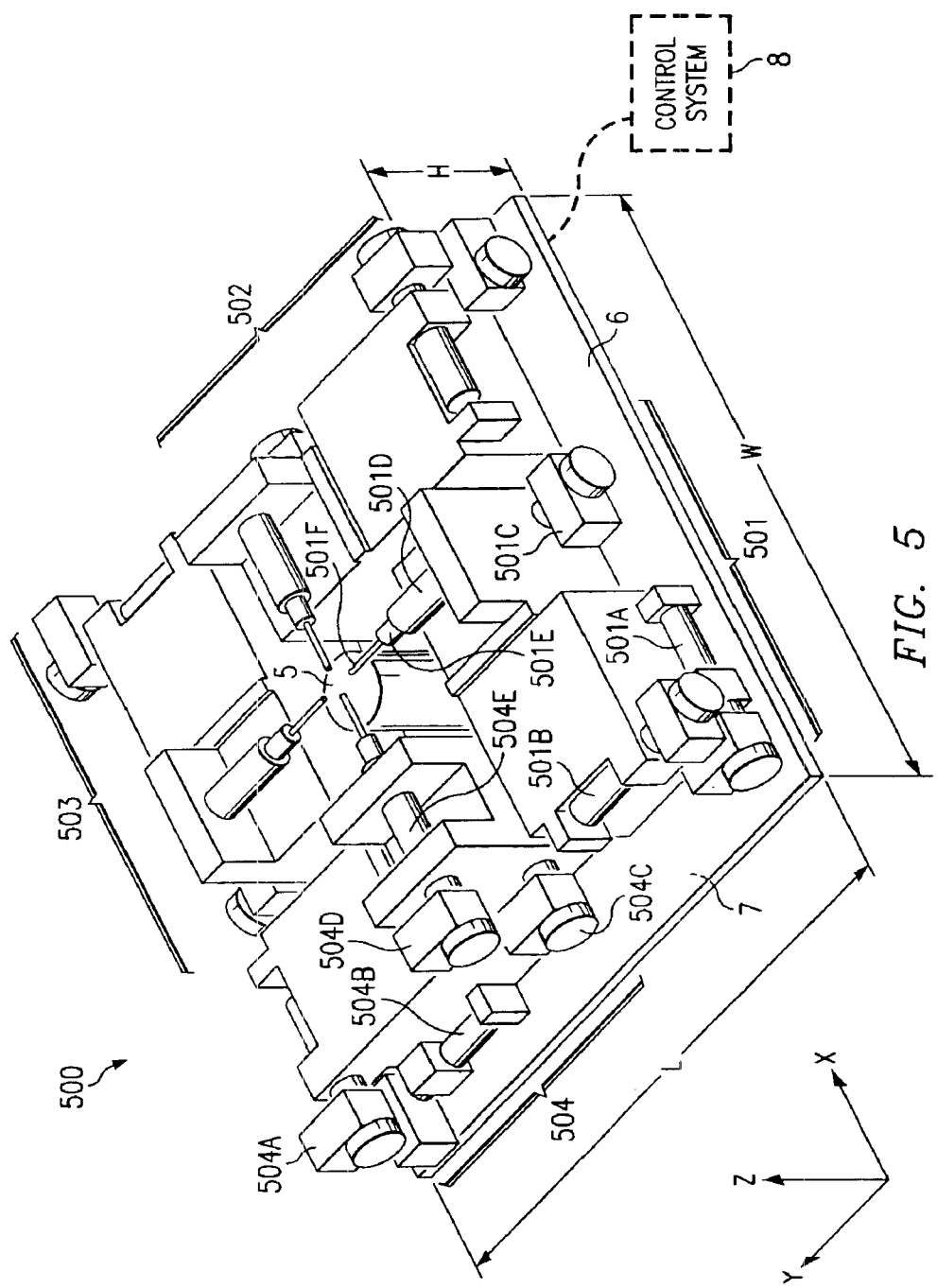
FIG. 5 shows an example implementation of a preferred embodiment of a manipulation platform.

FIG. 5 shows an example implementation of a preferred embodiment of a manipulation platform 500. In this example implementation, manipulation platform 500 includes base 6 on which a plurality of manipulator module interface sites are arranged, such as sites 1, 2, 3, and 4 of FIG. 3. In this example, a manipulator module is coupled to each of the base's interface sites. Thus, manipulator modules 501, 502, 503, and 504 are coupled to base 6. Preferably, such manipulator modules 501–504 are detachably coupled to base 6 such that a user may remove each module and replace it with a different module (such as a module selected from pool 400 of FIG. 4A). While four manipulator modules are shown as coupled to base 6 in the example configuration of FIG. 5, it should be understood that in alternative implementations a different number of such manipulator modules (either fewer than or greater than 4) may be so coupled to base 6. As described above, it is most preferable for base 6 to include at least four manipulator module interface sites (such as sites 14 shown in the example of FIG. 3), but depending on the type of manipulation desired by a user, a manipulator module need not be coupled to each interface site available on base 6.

Platform 500 comprises a sample stage 5 for receiving a sample to be studied using a microscope. Thus, manipulator modules 501–504 are arranged about such sample stage 5 and may be used to perform manipulation of a sample arranged on sample stage 5. Platform 500 further comprises an interface 7 that enables base 6 to be coupled to a microscope such that a sample arranged on sample stage 5 can be imaged by such microscope. Most preferably, interface 7 enables base 6 to be coupled at least to an SEM. Once platform 500 is coupled to a microscope, a sample arranged on sample stage 5 may be imaged as manipulator module(s) 501–504 are utilized to manipulate the sample. As further shown in FIG. 5, control system 8 may be coupled to platform 500 to enable a user to control the operation of manipulator modules 501–504 in order to manipulate a sample in the manner desired.

In this example, manipulator module 501 comprises a first drive mechanism that includes linear stepper microactuators 501A, 501B, and 501C. Manipulator module 501 further comprises a second drive mechanism that includes piezoelectric tube 501D. Manipulator module 501 further comprises an end-effector SOIF that is coupled to piezoelectric tube 501D via interface 501E. As shown, in this example, piezoelectric tube 501D of the second drive mechanism is coupled to the first drive mechanism (comprising linear stepper microactuators 501A–501C) such that the first drive mechanism is operable to move piezoelectric tube 501D (as well as end-effector 501F coupled to such piezoelectric tube 501D). More specifically, linear stepper microactuator 501A is operable to impart movement to piezoelectric tube SOID (and, in turn, end-effector 501F) along the X axis shown. Linear stepper microactuator 501B is operable to impart movement to piezoelectric tube 501D (and, in turn, end-effector 501F) along the Y axis shown, and linear stepper microactuator 501C is operable to impart movement to piezoelectric tube 501D (and, in turn, end-effector 501F) along the Z axis shown. Thus, manipulator module 501 is an example module that provides translation of end-effector 501F in three orthogonal dimensions (X, Y, and Z), such as with manipulator module 401 of FIG. 4A.

Linear stepper microactuators 501A–501C may each provide a relatively large travel range. For instance, each of linear stepper microactuators 501A–501C may provide a translation range of several millimeters. Thus, the first drive mechanism of manipulator module 501 may be controllably operable to move end-effector 501F up to several millimeters along the X, Y, and/or Z axes. The precision of positioning end-effector 501F using such linear stepper microactuators 501A–501C is generally limited by the resolution of the microactuator's step (i.e., the distance of each step). In this example implementation, the step resolution of linear stepper microactuators 501A–501C is approximately 30 nanometers, and therefore such microactuators may be used to position end-effector 501F to within approximately 30 nanometers of a desired position.

Further, in this example implementation, manipulator module 501 comprises a second drive mechanism that provides a relatively fine range of movement with great precision. More specifically, piezoelectric tube 501D is implemented as such a second drive mechanism to provide precise movement of end-effector 501F. In this example, piezoelectric tube 501D provides a translation range of several micrometers to end-effector 501F with resolution of approximately 1 nanometer. Such piezoelectric tube 501D may be utilized to move end-effector 501F in one or more dimensions (e.g., it may provide movement in three dimensions X, Y, and Z) a relatively small distance (e.g., up to several micrometers) with great precision (e.g., approximately 1 nanometer precision). Accordingly, such piezoelectric tube 501D may be utilized to controllably perform very precise positioning of end-effector 501F in order to perform desired manipulation of a sample arranged on sample stage 5.

In the example of FIG. 5, manipulator modules 502 and 503 are identical to module 501 described above. Thus, each of manipulator modules 502 and 503 includes a first drive mechanism that comprises three linear stepper microactuators for imparting a relatively long range of movement to the module's respective end-effector, and each of such manipulator modules 502 and 503 includes a second drive mechanism that comprises a piezoelectric tube for performing very precise positioning of the module's respective end-effector.

However, manipulator module 504 is different than manipulator modules 501–503. That is, in this example, a user has selectively coupled three identical manipulator modules 501–503 to platform 500, and has selectively coupled a different type of manipulator module 504 (which provides different operational capabilities) to platform 500. Similar to manipulator modules 501–503, manipulator module 504 comprises a first drive mechanism that includes linear stepper microactuators 504A, 504B, and 504C that are operable to provide relatively long range movement to the module's end-effector along the X, Y, and Z axes, respectively. Also similar to manipulator modules 501–503, manipulator module 504 further comprises a second drive mechanism that includes piezoelectric tube 504E that is operable to provide relatively fine, precise movement to the module's end-effector (e.g., in three dimensions X, Y, and Z). In addition, the first drive mechanism of manipulator module 504 further comprises a microactuator 504D that is operable to impart rotational movement to the module's end-effector. Preferably, microactuator 504D comprises a stick-slip type piezoelectric rotational actuator that can be operated in continuous 360 degree rotation and has an angular step resolution of less than 0.02 degree. Thus, manipulator module 504 is an example module that provides translation of its end-effector in three orthogonal dimensions (X, Y, and Z), as well as providing rotational movement of such end-effector, such as with manipulator module 402 of FIG. 4A.

Preferably, each of modules 501–504 are detachably coupled to base 6, such that a user may remove any one or more of such modules, and, if so desired, may replace the module with a different module (e.g., selected from pool 400 of FIG. 4A). Accordingly, it should be understood that by arranging the desired types of modules on the appropriate interface sites of base 6, a user may selectively configure platform 500 as desired for performing manipulation on a sample. Thus, in operation, a user may arrange a sample on sample stage 5 of platform 500. The user may further selectively couple desired manipulator modules, such as modules 501–504 shown in the example of FIG. 5, to one or more of the interface sites of platform 500. Platform 500 may then be coupled to a microscope in a manner that enables the sample on stage 5 to be imaged, and the user may utilize control system 8 to controllably manipulate the sample with the selected manipulator module(s) coupled to such platform 500.

Preferably, interface 7 enables platform 500 to be detachably coupled to at least one type of microscope for imaging a sample on sample stage 5. Most preferably, interface 7 enables platform 500 to be detachably coupled at least to SEMs. For instance, in the example implementation of FIG. 5, base 6 comprises a length "L" of approximately 10 cm, and a width "W" of approximately 10 cm. Further, in the example implementation of FIG. 5, platform 500 comprises an overall height "H" of approximately 4 cm. Such an implementation of platform 500 is capable of being detachably coupled at least with most commercially available SEMs (e.g., to their sample chamber) to enable manipulation of a sample arranged on sample stage 5 while such sample is being imaged by the SEM. Of course, in alternative embodiments, platform 500 may be implemented having different dimensions such that it is suitable for being detachably coupled with other types of microscopes in addition to or instead of SEMs in a manner that enables a sample on stage 5 to be imaged while it is being manipulated with one or more manipulator modules of platform 500.

Figure 6:
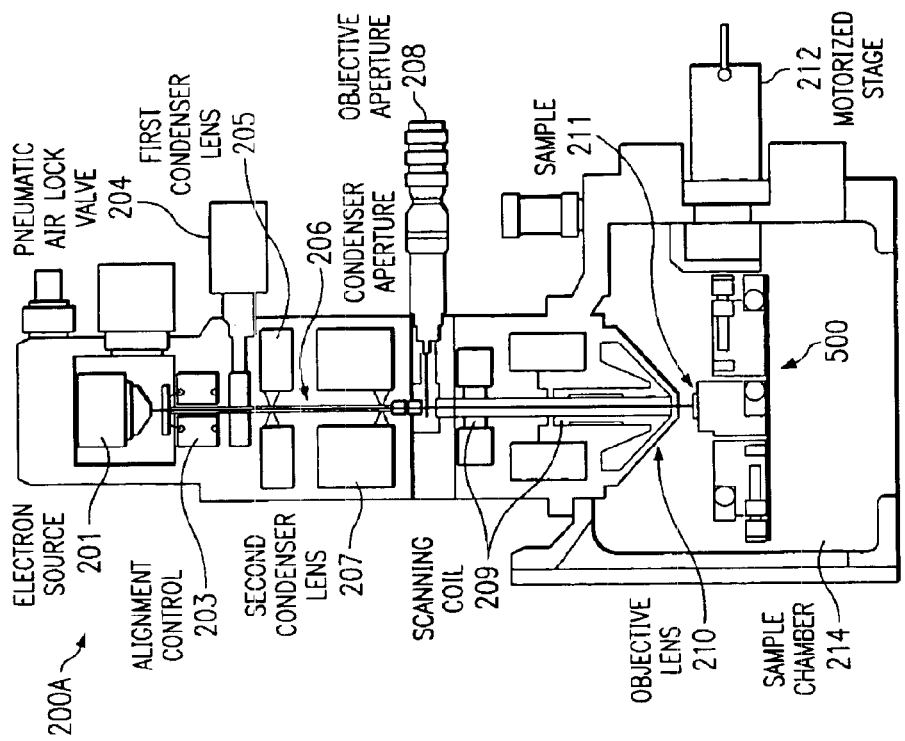
FIG. 6 shows an example implementation of a preferred embodiment of a manipulation platform coupled with an SEM.

FIG. 6 shows an example implementation of a manipulation platform of a preferred embodiment coupled with an SEM. More specifically, FIG. 6 shows platform 500 of FIG. 5 (in block diagram form) coupled with an SEM, such as the example SEM shown in block diagram 200A of FIG. 2. As shown, platform 500 is coupled with the SEM's sample chamber 214 such that a sample arranged on sample stage 5 may be imaged by the SEM. Further, while such sample is being imaged by the SEM, modules 501–504 may be controllably utilized to manipulate the sample in a desired manner.

In view of the above, a preferred embodiment provides a platform 10 that comprises a sample stage 5 and a plurality of interface sites 14 to enable a selected manipulator module to be coupled thereto. Preferably, such interface sites enable a manipulator module to be detachably coupled thereto such that a user can selectively implement the desired manipulator module(s) on platform 10 for performing a desired type of manipulation on a sample. That is, a user can selectively reconfigure the platform 10 by interchanging various different manipulator modules on the interface sites 14.

Figure 7:
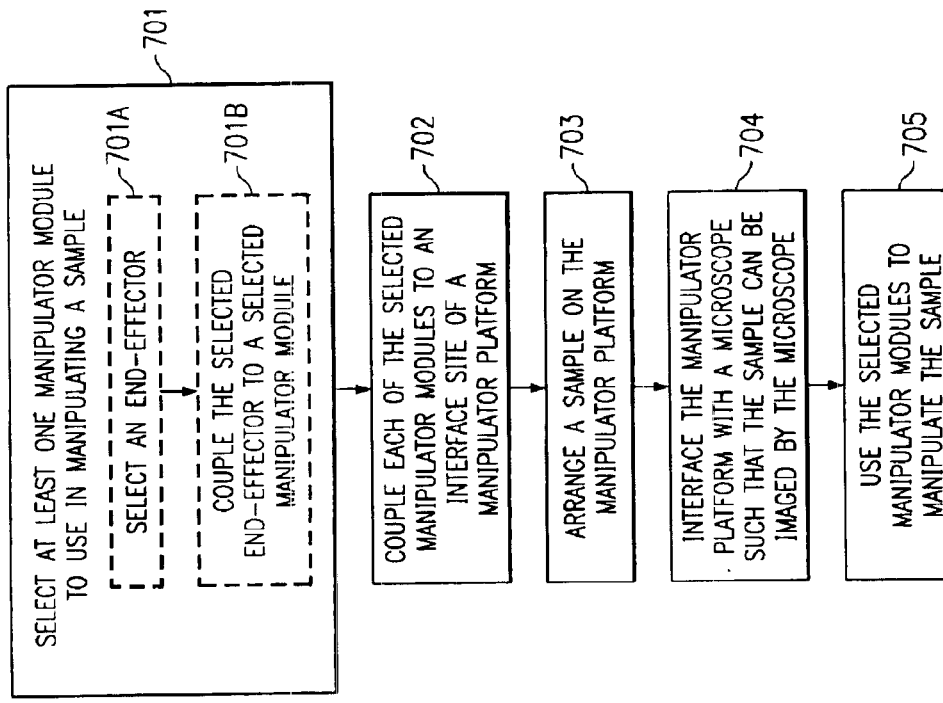
FIG. 7 shows an operational flow diagram that illustrates an example of how certain embodiments of the present invention may be utilized.

Turning now to FIG. 7, an operational flow diagram is shown that illustrates an example of how certain embodiments of the present invention may be utilized. More specifically, FIG. 7 shows an example operational flow diagram for configuring a manipulator platform (such as the example platform 500 of FIG. 5) and using such manipulator platform with a microscope to study a sample. As shown, in operational block 701 a user selects at least one manipulator module to use in manipulating a sample. For example, a user may select one or more desired types of manipulator modules from a pool of such modules (e.g., pool 400 of FIG. 4A). As further shown in FIG. 7, in selecting a desired type of manipulator module, a user may, in operational block 701A, select a desired type of end-effector to be coupled to such manipulator module. That is, in certain embodiments, a manipulator module may comprise an interface that enables any of a plurality of different types of end-effectors, such as the end-effectors of pool 450 of FIG. 4B, to be detachably coupled to such manipulator module. Accordingly, in operational block 701A a user may select a desired type of end-effector, and in operational block 701B, a user may couple the selected end-effector to a selected manipulator module. Of course, in certain embodiments, a manipulator module may already comprise a desired end-effector coupled thereto and/or a manipulator module may not comprise an interface that enables an end-effector to be detachably coupled therewith (e.g., the manipulator module may comprise a "fixed" end-effector). Thus, operational blocks 701A and 701B are shown in dashed line as being optional.

In operational block 702, the manipulator module(s) selected in block 701 are each coupled to an interface site of a manipulator platform, such as interface sites 1–4 of manipulator platform 10 of FIG. 3. Thus, by coupling the desired manipulator modules to a manipulator platform, the user configures the manipulator platform as desired (e.g., to perform a desired type of manipulation of a sample). In block 704, a user arranges a sample on a sample stage of the manipulator platform, such as on sample stage 5 of manipulator platform 10 shown in FIG. 3. In operational block 704, the manipulator platform is interfaced with a microscope, such as an SEM, such that the sample can be imaged by the microscope. Thereafter, in operational block 705, the selected manipulator modules coupled to the manipulator platform are used to manipulate the sample, preferably while such sample is being imaged by the microscope.

As described above, manipulation platform 10 preferably comprises a plurality of interface sites, each for receiving a manipulation module. Most preferably, at least four manipulation modules may be implemented within such manipulation platform 10. Having a plurality of manipulation modules enables various types of measurements to be acquired for a sample under study. Certain embodiments of the present invention enable measurements that have traditionally been unavailable because of an insufficient number of manipulation mechanisms being implemented for a microscope's manipulation system.

For example, with conductive and sharp probes, such as etched conductive W, Pt, Au probes, implemented as an end-effector, conductivity measurement can be performed on a nanometer-scale section of a sample either placed on the surface of sample stage 5 or suspended in free space by positioning two probes on the surface of the sample (i.e., using two probes to hold the sample in free space and one or more other probes to acquire measurements of sample). With 4 manipulator modules on one platform, a four-probe kelvin conductivity measurement can be conducted down to the nanometer-scale on samples under study. One advantage of a four-probe conductivity measurement is that the contact resistance effect intrinsic to the formed interface between the probe and the sample can be neutralized, and the exact conductance of the sample can be obtained, which is not possible for two or three probe conductivity measurement. A multi-module manipulator design also facilitates the ready prototyping of devices inside the microscope. For example, a three-probe manipulator (e.g., manipulation platform 10 comprising 3 manipulator modules) can implement a field effect transistor measurement utilizing the third probe to apply a gate voltage while measuring the "IV" (current, voltage) characteristic of the sample from the other two probes. With use of other types of end-effectors, such as force probes, force measurement or combined force/electrical measurement can also be realized down to the nanometer-scale. As those of skill in the art will appreciate, embodiments of the present invention enable various other types of measurements and/or characterizations to be acquired for a sample.

Further, the manipulation system of certain embodiments of the present invention may be utilized to perform assembly operations on micro- and/or nano-scale objects. For example, a plurality of samples may be arranged on stage 5, and manipulation modules (such as modules 501–504 of FIG. 5) may, in certain applications, be used to assemble such samples into a desired structure. Additionally, various other applications of such a manipulation system will be recognized by those of ordinary skill in the art.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A platform comprising:
   an interface for detachably coupling to an electron microscope;
   a sample stage; and
   a plurality of interfaces for receiving manipulator modules for manipulating a sample on said sample stage, wherein said plurality of interfaces are each for detachably coupling a manipulator module to said platform.

2. The platform of claim 1 wherein said electron microscope comprises a scanning electron microscope (SEM).

3. The platform of claim 1 wherein said interface is suitable for said platform to be inserted into a sample chamber of said electron microscope.

4. The platform of claim 1 wherein said manipulator module comprises an end-effector and a drive mechanism for driving movement of said end-effector for manipulating said sample.

5. A system comprising:
   a platform having a sample stage and an interface for coupling to a microscope such that a sample arranged on said sample stage can be imaged by said microscope; and
   a plurality of manipulator modules detachably coupled to said platform for manipulating a sample arranged on said sample stage, wherein multiple ones of said plurality of manipulator modules are simultaneously operable for manipulating said sample.

6. The system of claim 5 wherein said microscope comprises an electron microscope.

7. The system of claim 6 wherein said microscope comprises a scanning electron microscope (SEM).

8. The system of claim 5 wherein each of said plurality of manipulator modules comprises an end-effector and a drive mechanism for driving movement of said end-effector.

9. The system of claim 8 wherein said drive mechanism is operable to generate movement of said end-effector in at least two dimensions.

10. The system of claim 8 wherein said drive mechanism is operable to generate movement of said end-effector in at least three dimensions.

11. The system of claim 8 wherein said drive mechanism of each of said plurality of manipulator modules is independently operable to drive movement of its respective manipulator module's end-effector.

12. The system of claim 8 wherein said drive mechanism comprises a first actuator for coarsely moving said end-effector.

13. The system of claim 12 wherein said coarsely moving said end-effector comprises moving said end-effector with precision of approximately 30 nanometers.

14. The system of claim 12 wherein said first actuator is operable to provide at least two millimeters range of movement to said end-effector.

15. The system of claim 12 wherein said first actuator comprises an actuator selected from the group consisting of:
   linear stepper microactuator, stick-slick piezoelectric microactuator, ultrasonic piezoelectric microactuator, and inchworm piezoelectric microactuator.

16. The system of claim 12 wherein said drive mechanism further comprises a second actuator for precisely moving said end-effector.

17. The system of claim 16 wherein said precisely moving said end-effector comprises moving said end-effector with at least nanometer-scale precision.

18. The system of claim 16 wherein said second actuator comprises an actuator selected from the group consisting of:
   piezoelectric tube, piezostack, piezo bimorph microactuator, and piezo plate.

19. The system of claim 16 wherein said second actuator comprises a quadruple electroded piezoelectric tube.

20. The system of claim 8 wherein said drive mechanism comprises an actuator for precisely moving said end-effector.

21. The system of claim 20 wherein said precisely moving said end-effector comprises moving said end-effector with at least nanometer-scale precision.

22. The system of claim 20 wherein said actuator for precisely moving said end-effector comprises an actuator selected from the group consisting of:
   piezoelectric tube, piezostack, piezo bimorph microactuator, and piezo plate.

23. The system of claim 20 wherein said actuator for precisely moving said end-effector comprises a quadruple electroded piezoelectric tube.

24. The system of claim 8 wherein said end-effector comprises one selected from the group consisting of:
   probe, gripper, glass fiber, hypodermic needle, hook, and hose.

25. The system of claim 5 wherein said plurality of manipulator modules are detachably coupled to said platform for manipulating said sample while said sample is being imaged by said microscope.

26. The system of claim 5 wherein said plurality of manipulator modules are detachably coupled to said platform for manipulating said sample while said platform is coupled to said microscope.

27. The system of claim 5 wherein said interface is suitable for said platform to be inserted into a sample chamber of said microscope.

28. A portable sample holder for holding a sample for presentation to a microscope, said portable sample holder comprising:
 a stage for receiving a sample;
 a plurality of interface sites, each of said plurality of interface sites for receiving a manipulator module, said manipulator module comprising an end-effector and a drive mechanism for driving movement of said end-effector for manipulating the received sample, wherein said plurality of interface sites are arranged such that multiple manipulator modules coupled thereto are simultaneously operable for manipulating the received sample; and
 an interface for coupling with a microscope.

29. The portable sample holder of claim 28 wherein said interface for coupling with a microscope comprises an interface for detachably coupling with said microscope.

30. The portable sample holder of claim 28 wherein said microscope comprises an electron microscope.

31. The portable sample holder of claim 30 wherein said microscope comprises a scanning electron microscope (SEM).

32. The portable sample holder of claim 28 wherein said drive mechanism is operable to generate movement of said end-effector in at least two dimensions.

33. The portable sample holder of claim 28 wherein said drive mechanism is operable to generate movement of said end-effector in at least three dimensions.

34. The portable sample holder of claim 28 wherein said drive mechanism comprises a first actuator for coarsely moving said end-effector.

35. The portable sample holder of claim 34 wherein said coarsely moving said end-effector comprises moving said end-effector with precision of approximately 30 nanometers.

36. The portable sample holder of claim 34 wherein said first actuator is operable to provide at least two millimeters range of movement to said end-effector.

37. The portable sample holder of claim 34 wherein said first actuator comprises an actuator selected from the group consisting of:
 linear stepper microactuator, stick-slick piezoelectric microactuator, ultrasonic piezoelectric microactuator, and inchworm piezoelectric microactuator.

38. The portable sample holder of claim 34 wherein said drive mechanism further comprises a second actuator for precisely moving said end-effector.

39. The portable sample holder of claim 38 wherein said precisely moving said end-effector comprises moving said end-effector with at least nanometer-scale precision.

40. The portable sample holder of claim 38 wherein said second actuator comprises an actuator selected from the group consisting of:
 piezoelectric tube, piezostack, piezo bimorph microactuator, and piezo plate.

41. The portable sample holder of claim 38 wherein said second actuator comprises a quadruple electroded piezoelectric tube.

42. The portable sample holder of claim 38 wherein said drive mechanism comprises an actuator for precisely moving said end-effector.

43. The portable sample holder of claim 42 wherein said precisely moving said end-effector comprises moving said end-effector with at least nanometer-scale precision.

44. The portable sample holder of claim 42 wherein said actuator for precisely moving said end-effector comprises an actuator selected from the group consisting of:
 piezoelectric tube, piezostack, piezo bimorph microactuator, and piezo plate.

45. The portable sample holder of claim 42 wherein said actuator for precisely moving said end-effector comprises a quadruple electroded piezoelectric tube.

46. The portable sample holder of claim 28 wherein said end-effector comprises one selected from the group consisting of:
 probe, gripper, glass fiber, hypodermic needle, hook, and hose.

47. A method of manipulating a sample under study with a microscope, said method comprising:
 selecting multiple manipulator modules to use in manipulating a sample;
 detachably coupling each of said multiple manipulator modules to one of a plurality of interface sites on a manipulator platform;
 arranging a sample on said manipulator platform;
 interfacing said manipulator platform with a microscope such that the sample arranged thereon can be imaged by the microscope; and
 using said multiple manipulator modules coupled to said manipulator platform to manipulate the sample, wherein said multiple manipulator modules are simultaneously operable to manipulate the sample in concert with one another.

48. The method of claim 47 wherein said microscope comprises an electron microscope.

49. The method of claim 47 wherein said microscope comprises a scanning electron microscope (SEM).

50. The method of claim 47 wherein each of said multiple manipulator modules comprises an end-effector and a drive mechanism for driving movement of said end-effector.

51. The method of claim 50 wherein said drive mechanism comprises an actuator for precisely moving said end-effector.

52. The method of claim 51 wherein said precisely moving said end-effector comprises moving said end-effector with at least nanometer-scale precision.

53. The method of claim 51 wherein said actuator for precisely moving said end-effector comprises an actuator selected from the group consisting of:
 piezoelectric tube, piezostack, piezo bimorph microactuator, and piezo plate.

54. The method of claim 51 wherein said actuator for precisely moving said end-effector comprises a quadruple electroded piezoelectric tube.

55. The method of claim 47 wherein said step of interfacing said manipulator platform with a microscope comprises:
 inserting said manipulator platform into a sample chamber of said microscope.

56. The method of claim 47 wherein said step of using said multiple manipulator modules coupled to said manipulator platform to manipulate the sample comprises:
 using said multiple manipulator modules to manipulate the sample while imaging the sample with said microscope.

57. The system of claim 8 wherein said end-effector comprises a conductive probe.

58. The system of claim 8 wherein said end-effector comprises a force probe.

59. The system of claim 8 wherein said end-effector comprises a force measurement.

* * * * *

UNITED STATES PATENT AND TRADEMARK OFFICE
CERTIFICATE OF CORRECTION

PATENT NO. : 6,891,170 B1
DATED : May 10, 2005
INVENTOR(S) : Yu et al.

It is certified that error appears in the above-identified patent and that said Letters Patent is hereby corrected as shown below:

Column 1,
Line 43, "a" should read -- $\alpha$ --.

Column 10,
Lines 31, 36 and 40, "14" should read -- 1-4 --.

Column 11,
Line 58, "14" should read -- 1-4 --.

Column 12,
Lines 17, 44 and 48, "14" should read -- 1-4 --.

Column 13,
Line 14, "14" should read -- 1-4 --.

Column 17,
Line 27, "14" should read -- 1-4 --.
Line 52, "SOIF" should read -- 501F --.
Line 60, "SOID" should read -- 501D --.

Column 19,
Lines 58 and 65, "14" should read -- 1-4 --.

Signed and Sealed this

Twelfth Day of July, 2005

JON W. DUDAS
*Director of the United States Patent and Trademark Office*